United States Patent [19]
Glaser et al.

[11] Patent Number: 5,399,624
[45] Date of Patent: Mar. 21, 1995

[54] HIGH PURITY RESINS FOR THIOL-ENE POLYMERIZATIONS AND METHOD FOR PRODUCING SAME

[75] Inventors: David M. Glaser, New Britain; Anthony F. Jacobine, Meriden; Paul J. Grabek, Deep River, all of Conn.

[73] Assignee: Loctite Corporation, Hartford, Conn.

[21] Appl. No.: 56,128

[22] Filed: Apr. 30, 1993

Related U.S. Application Data

[63] Continuation-in-part of Ser. No. 746,649, Aug. 16, 1991, Pat. No. 5,208,281, which is a continuation-in-part of Ser. No. 651,271, Feb. 5, 1991, Pat. No. 5,167,882, which is a continuation-in-part of Ser. No. 632,391, Dec. 21, 1990, abandoned.

[51] Int. Cl.$^6$ .................. C08F 279/00; C08F 8/42
[52] U.S. Cl. .................. 525/289; 525/290; 525/368; 525/369; 528/489
[58] Field of Search .......... 528/489; 525/289, 350, 525/368, 369, 290; 526/280, 283

[56] References Cited

U.S. PATENT DOCUMENTS

| | | | |
|---|---|---|---|
| 3,445,419 | 5/1969 | Vanderlinde | 260/46.5 |
| 3,582,521 | 6/1971 | Villa | 260/45.75 K |
| 3,619,393 | 11/1971 | Stahly | 522/10 |
| 3,661,744 | 5/1972 | Kehr et al. | 522/24 |
| 4,008,341 | 2/1977 | Kehr | 427/44 |
| 4,119,617 | 10/1978 | Hanyuda et al. | 528/360 |
| 4,157,421 | 6/1979 | Schmidle et al. | 428/419 |
| 4,230,740 | 10/1980 | Moyer | 427/54.1 |
| 4,289,867 | 9/1981 | Martin | 528/12 |
| 4,585,838 | 4/1986 | Wang et al. | 528/489 |
| 4,668,807 | 5/1987 | Darbellay et al. | 528/489 |
| 4,808,638 | 2/1989 | Steinkraus et al. | 522/24 |
| 4,962,221 | 10/1990 | Huntress et al. | 556/456 |

(List continued on next page.)

FOREIGN PATENT DOCUMENTS

| | | |
|---|---|---|
| 338616 | 10/1989 | European Pat. Off. . |
| 393672 | 10/1990 | European Pat. Off. . |
| 0289852 | 3/1992 | European Pat. Off. . |
| 1528031 | 9/1975 | United Kingdom . |

OTHER PUBLICATIONS

Search results in file "CA", Sep. 4, 1990.
Abstract: "Stable, curable thilene compsns.–stabilised with non–acidic nitroso cpds., pref. norbornene thiol compsns.", EP0428342 910522.
Abstract: "Polymer in Microelectronics, Fundamentals and Applications", David S. Soane, Department of Chemical Engineering, University of California, Berkeley, Calif. and Zoya Martynenko, Technical Consultant, Piedmont, Calif. p. 255, 1989.

(List continued on next page.)

*Primary Examiner*—Tae H. Yoon
*Attorney, Agent, or Firm*—Vidas, Arrett & Steinkraus

[57] ABSTRACT

A treatment method for polyene resins used in thiol-ene formulations, especially norbornene resins, significantly stabilizes thiol-ene compositions made from batches of polyene resin which otherwise give compositions with poor dark stability. The treatment comprises contacting the polyene with an amphoteric treating agent selected from the group consisting of silicated magnesium oxide, basic aluminum oxide, silica gel, magnesium oxide, magnesium hydroxide, calcium oxide, calcium hydroxide, barium oxide, and barium hydroxide, and then separating the resin from the treating agent prior to mixture with a polythiol to form a thiol-ene composition. The treatment method significantly reduces ionic content in polyene resins, particularly chloride ion but also sodium and potassium ions. Consequently, treatment is also beneficial with polyene resins which do not produce substantial dark stability problems. Reduction of the ionic content of the resin is desirable to produce cured thiolene polymers with low electrical conductivity and low corrosiveness.

16 Claims, No Drawings

U.S. PATENT DOCUMENTS

| | | | |
|---|---|---|---|
| 4,985,471 | 1/1991 | Ohta et al. | 522/27 |
| 5,021,512 | 6/1991 | Woods et al. | 525/350 |
| 5,034,490 | 7/1991 | Jacobine et al. | 528/30 |
| 5,167,882 | 12/1992 | Jacobine et al. | 264/22 |
| 5,171,816 | 12/1992 | Jacobine et al. | 528/15 |
| 5,182,360 | 1/1993 | Jacobine et al. | 528/205 |
| 5,208,281 | 5/1993 | Glaser | 524/189 |
| 5,245,007 | 9/1993 | Yamamoto et al. | 528/489 |

OTHER PUBLICATIONS

Abstract: "Polymeric Materials for Electronics Packaging and Interconnection", John H. Lupinski, Editor, General Electric Company, and Robert S. Moore, Editor, Eastman Kodak Company, American Chemical Society, Washington, DC 1989.

Abstract: "Thiol–Olefin Cooxidation (TOCO) Reaction. 9. A Self–Consistent Mechanism under Non–radical–Inducing Conditions", American Chemical Society 1987.

Abstract: "Process for reducing the undesirable halide content of epoxy resins", EP 441284 A2 14 Aug. 1991.

Abstract: "Preparation of epoxy resins with extraction of alkali metal halide as aqueous solution", EP 340716 A2 8 Nov. 1989.

Abstract: "Manufacture of high–molecular–weight fireproofing agents", JP 01185323 A2 24 Jul. 1989.

Abstract: "Purification of epoxy compounds by azeotropic distillation of water", JP 63268723 A2 7 Nov. 1988.

Abstract: "Method for reducing the aliphatic halide content of epoxy resins using a solvent mixture including a polar aprotic solvent", U.S. Pat. No. 4,785,061 15 Nov. 1988.

Abstract: "Preparation of epoxy compounds with low hydrolyzable halogen content", JP 63159376 A2 2 Jul. 1988.

Abstract: "Manufacture of epoxy resins with low halogen content", JP 62256821 A2 9 Nov. 1987.

Abstract: "Preparation of low halide content epoxy resins", Res. Discl. 276,221 1987.

Abstract: "Highly–pure amino alcohols", JP 61293933 A2 24 Dec. 1986.

Abstract: "Epoxy resins containing low levels of total halide", U.S. Pat. No. 4,585,838 29 Apr. 1986.

Abstract: "Resist ink cleaning solvent compositions", JP 60149675 A2 7 Aug. 1985.

Abstract: "Halide collector and its uses", JP 59209644 A2 28 Nov. 1984.

Abstract: "Removal of very small amounts of halogen from epoxy resins", JP 58173116 A2 12 Oct. 1983.

Abstract: "Epoxy resin coating removers", JP 54099134 4 Aug. 1979.

Abstract: "Removal of epoxy resin from histological sections following halogenation", Stain Technol. 43(6), 344–6, 1968.

Abstract: "Treatment of inorganic salts contaminated with organic compounds", EP 356854 A2 7 Mar. 1990.

Abstract: "Effect of contaminants in low–molecular–weight dian epoxy resin on the rateof its reaction with dian", Polimery (Warsaw), 28(7), 234–6, 1983.

Abstract: "Purification of epoxy resins", JP 62064817 A2 23 Mar. 1987.

Abstract: "Epoxy resin purification", JP 60054376 A2 28 Mar. 1985.

Abstract: "Epoxy novolac resins with low hydrolyzable chlorine and low ionic chloride content", U.S. Pat. No. 4,485,221 27 Nov. 1984.

Abstract: "Removal of Peroxide Impurities by Zeolites", J. Org. Chem. 1980.

Abstract: "Oxidative addition of mercaptans to olefins in the presence of a halide", Chemische Berichte, vol. 93 1960, pp. 2415–2423.

Abstract: "Nanoscale Metal Oxide Particles as Chemical Reagents. Heats of Absorption of Heteroatom–Containing Organics on Heat–Treated Magnesium Oxide Samples of Varying Surface Areas", Chem. Mater. 1991, 3, pp.182–187.

Abstract: "Process for the Purification of Esters of Mercapto Acids", Shaw, U.S. Pat. No. 4,994,150, 19 Feb. 1991.

Abstract: "Process for Improving Adhesion of Polysiloxane Coating to Polymeric Substrates via Reduced Alkai Metal Cation Content", Anderson, U.S. Pat. No. 5,069,942 12 Dec. 1991.

Hoyle et al, "Laser–Initiated Polymerization of a Thiol–ene System," *Polymer Photochemistry*, 4, (1984) 69–80.

J. G. Kloosterboer et al, "Photopolymers Exhibiting A (List continued on next page.)

OTHER PUBLICATIONS

Large Difference Between Glass Transition and Curing Temperature," *Polymer*, 1990, 31, 95–101.

Doornkamp, A. T. et al, "Kinetic Study of the Ultraviolet-Initiated Polymerization of a Polyester Urethane Diacrylate by Differential Scanning Calorimetry," *Polymer Communications*, 1990, 31, 362–365.

Kloosterboer, "Network Formation by Chain Cross-linking Photopolymerization and Its Application in Electronics," *Advances In Polymer Science, Polymers In Electronics*, 84, 1–61 (1988).

Jacobine et al, "Photoinitiated Cross-Linking of Norbornene Resins with Multifunctional Thiols," CPT. 13 of Radiation Curing of Polymeric Materials, Hoyle et al, Eds, ACS Symposium Series 417, pp. 160–175 (1990).

Jacobine et al, "Photocrosslinking of Norbornene Resins with Multifunctional Thiols," *Proceedings of of the ACS Division of Polymeric Materials:Science and Engineering*, 60, pp. 211–216 (1989).

Chem. Abst., 80: 122232z (Abstracting JP 48–004374 Feb. 1973).

Chem. Abst., 106: 156990r (Abstracting CS 229529 Aug. 1986).

Chem. Abst., 81: 137494f (Abstracting JP 49–053944 May 1974), and Derwent WPI abstract 74–89315v for same JP reference.

Chem. Abst., 104: 159338d.

Chem. Abst., 95: 163994c.

Chem. Abst., 94: 54710r.

Chem. Abst., 100: 69316h (Abstracting US 4413108 Nov. 1983) and Derwent WPI abstract 83–820483/46 for same US reference.

Derwent Abstract JP 40–053944.

"Thiol–Olefin Cooxidation TOCO Reaction . . . " by Valerian T. D'Souza et al from J. Org. Chem 1987,52,1729–1740.

"Oxidation Addition of Mercaptans To Olefins In the Presence of A Halide" by Bredereck, H.; A. Wagner, translated from Germany by Scientific Translation Services.

"Dilatometric Studies of the Behavior of Some Inhibitors . . . " by Paul Bartlett and Harold Kwart, Journal of Am Chemical Society Mar. 23, 1950, vol. 72, No. 3.

Die Makromolekulare Chemie 97(1966) 258–266(Nr. 2156).

"Organic Sulfur Compounds X1X" by Alexis A. Oswald et al.

HIGH PURITY RESINS FOR THIOL-ENE POLYMERIZATIONS AND METHOD FOR PRODUCING SAME

CROSS-REFERENCE TO RELATED APPLICATION

This application is a continuation-in-part of application, Ser. No. 07/746,649, filed Aug. 16, 1991, U.S. Pat. No. 5,208,281, incorporated herein by reference, which is a continuation-in-part of Ser. No. 651,271, filed Feb. 5, 1991, U.S. Pat. No. 5,167,882, which is a continuation-in-part of Ser. No. 632,391, filed Dec. 21, 1990, abandoned.

DEFINITIONS

As used herein:

A polyene is a compound having a plurality of olefinically unsaturated groups.

A polythiol is a compound having plurality of organic thiol groups.

A thiol-ene composition is a mixture of a polyene and a polythiol formulated to cure at least predominately by addition of thiol groups across the olefinic double bond of the polyene. Generally the composition will include a free radical initiator such as a peroxy compound or a free radical photoinitiator to initiate the thiol-ene addition reactions.

Norbornenyl groups, as used herein, are broadly defined to encompass organic functional groups of the formula:

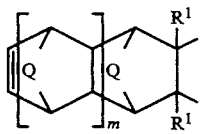

where Q is $CR_2^1$, O, S, $NR^1$ or $SO_2$, $R^1$ is H or alkyl; and m is 0–10. Thus the term should be understood to encompass, in addition to true norbornenyl groups, various substituted analogs, nadic groups and various other cyclopentadiene Dieis-Alder polyadducts.

BACKGROUND ART

In thiol-olefin cooxidation reactions it has been reported that chloride ion and bromide ion shortened an initial slow oxygen-absorbing phase while iodide ion prolonged the initial phase and decreased its rate. Bredereck et al, *Chemische Berichte*, 93 2415–2423 (1960); D'Souza et al, *J. Org. Chem.* 1987, 41, 1729–1740. Several hypotheses are offered in the latter reference as possible explanations of the difference between chloride/bromide and iodide in this reaction, but no conclusions are drawn as to which of the hypotheses are correct.

Organohalo compounds, such as tris(2,3-dibromopropyl) phosphate and tetrabromophthalic anhydride (0.1–10 %) in combination with mercaptans (0.05–5%) are said to improve melt spin properties of polyolefin compounds. *Chem. Abst.*, 80:1222322 (abstracting JP 48004374).

The polymerization of methacrylate ester monomers during neutralization, washing and/or extraction with base is reported to be inhibited by adding 0.03–0,3 % NaNO2 and/or KI to the solutions. *Chem. Abst.*, 106; 156990r (abstracting CS 229529).

Heat stability of a nylon to polymer containing a copper stearate, KI, and 2-mercaptobenzimidazole is reported to be improved over comparable formulations omitting either the KI or the mercapto compound in *Chem. Abst.*, 81:137494f (abstracting JP 49053944).

Halogen containing compounds such as 2,4-bis(trichloromethyl)-6-methyl-s-triazine are reported as components of an initiator system, which also uses an organic thiol component, for anaerobically curing formulations in *Chem. Abst.*, 100: 69316h (abstracting U.S. Pat. No. 4,413,108).

In Bartlett et al, JACS, 72, 1051–1059 (1950), iodine was reported to have a dual effect on peroxide catalyzed polymerizations of vinyl acetate, rapidly accelerating polymerization at moderate concentrations but behaving as a rather strong inhibitor at low concentrations. $I_3$.radical is postulated as a terminator of growing polymer chain to explain the inhibition affection. A polar mechanism is postulated to explain the acceleration at higher concentrations.

BACKGROUND OF THE INVENTION

Curable thiol-ene systems are described in U.S. Pat. No. 3,661,744; U.S. Pat. No. 4,119,617; U.S. Pat. No. 4,289,867; U.S. Pat. No. 3,445,419 and U.S. Pat. No. 4,808,638. Such formulations employ a polyene functional resin, a polythiol and a free radical initiator.

In U.S. Pat. No. 4,808,638 there are described photocurable thiol-ene compositions comprising a norbornene functional resin, a polythiol and a free radical photoinitiator. Further description of this system may be found in Jacobine et al, *Proceedings of ACS Division of Polymeric Materials: Science and Engineering*, Vol. 60, pp. 211–216 (1989).

Norbornenyl functional resins and their uses are described in U.S. Pat. No. 4,808,638 and references cited therein. The disclosed use of such resins in this reference is as the polyene resin in radically cured thiol-ene formulations. The aforementioned U.S. patent is incorporated herein by reference.

Further norbornenyl functional compounds useful in thiol-ene compositions as described in U.S. Pat. No. 4,808,638, U.S. Pat. No. 5,034,490, U.S. Pat. No. 5,171,816 and U.S. Pat. No. 5,182,360 and copending applications Ser. No. 07/315,737 filed Feb. 24, 1989 and Ser. No. 07/619,068 filed Nov. 28, 1990.

Dark stability of thiol-ene curable formulations has been a problem for a number of these systems, particularly those where the polyene is a plural norbornene compound. The norbornene-thiol system, however, is an especially desirable system because of its very high cure speed, good cured polymer properties and the ready availability of norbornene resins from acrylate ester precursors.

Various attempts have been made to improve upon the dark stability of thiol-ene systems by use of improved stabilizers. References pertaining to these efforts include U.S. Pat. No. 3,619,393; U.S. Pat. No. 5,208,281; and EP 428,342. Such improvements, however, are not always satisfactory in achieving consistent, commercially acceptable shelf lives. In particular, it has been noticed that certain batches of ene resins are extremely difficult to formulate into shelf-stable thiol-ene compositions.

SUMMARY OF THE INVENTION

It has now been discovered that treatment of a norbornene resin, prior to mixture with a polythiol to form a thiol-ene composition, significantly stabilizes compositions made from batches of ene resin which have previously given the greatest stability problems. The treatment comprises contacting the polyene with an amphoteric treating agent selected from the group consisting of silicated magnesium oxide, basic aluminum oxide, silica gel, magnesium oxide, magnesium hydroxide, calcium oxide, calcium hydroxide, barium oxide, and barium hydroxide, and then separating the resin from the treating agent.

It has been found that treatment with such amphoteric substances significantly reduces ionic content in polyene resins, particularly chloride ion but also sodium and potassium ions. Consequently, treatment is considered beneficial even with polyene resins which do not produce substantial dark stability problems. Reduction of the ionic content of the resin is desirable to produce cured thiol-ene polymers with low electrical conductivity and low corrosiveness.

DETAILED DESCRIPTION OF THE INVENTION

The amphoteric substance used to treat the polyene resins is selected from the group consisting of silicated magnesium oxide, basic aluminum oxide, silica gel, magnesium oxide, magnesium hydroxide, calcium oxide, calcium hydroxide, barium oxide and barium hydroxide. The average particle size of the amphoteric substance is preferably in the range of about 2 microns to about 200 microns. A particularly preferred amphoteric agent is Magnesol ® Polysorb 30/40 hydrated silicated magnesium oxide, which has a particle size range of from about 2 to about 200 microns and an average particle size of 50 microns.

Contact time with the polyene resin will vary depending upon the temperature employed and the moisture content and viscosity of the resin. The time should be for sufficient time to reach a Cl⁻ content of less than 1.0 ppm, preferably to 0.5 ppm or less, or for sufficient time to improve the shelf life of a thiolene composition prepared by mixing the polyene with a polythiol after the amphoteric treating agent has been separated from the polyene. The treatment can also be used to reduce sodium and potassium levels below 1 ppm, suitably 0.5 or less. Typical contact times will be between 1 hour and 3 days. Treatment efficiency can be improved, lessening necessary contact time, if the polyene has a small moisture content, suitably, 0.01%–1.0%. When a dry resin is used and moisture can readily be removed subsequent to treatment, e.g. by vacuum stripping, it may be desirable to add moisture to the treatment mixture.

Contact temperatures will also vary depending on viscosity of the polyene. Effective ion removal can be obtained at temperatures between 0° C. and 100° C. provided that the polyene is sufficiently non-viscous at the temperature employed to allow for good agitation of the mixture.

The amphoteric treating agent must be removed from the polyene resin prior to formulation into a curable composition, such as a thiol-ene composition. Separation can be accomplished by filtration but in some cases where the amphoteric treating agent has a clay-like consistency addition of a filter aid such as Celite ® to the treatment mixture prior to filtration is necessary for effective filtration. Addition of the filter aid does not appear to influence the effectiveness of the amphoteric treating agent in removing ionic species or in improving shelf-life stability of thiolene compositions produced from the treated resin.

The plural norbornene functional compounds useful in the invention are known from U.S. Pat. No. 4,808,638, incorporated herein by reference, and have recently also been described in Jacobine et al, "Photoinitiated Cross-linking of Norbornene Resins with Multifunctional Thiols", Chapter 13 of *Radiation Curing of Polymeric Materials*, ACS Symposium Series #417, American Chemical Society, 1990, and U.S. Pat. No. 5,167,882, also incorporated herein by reference. Particularly preferred norbornene compounds are norbornenemethyl norbornenecarboxylate and norbornene carboxylate esters of polyols such as 1,6-hexanediol, trimethylolpropane, ethoxylated bisphenol A, poly(tetramethyleneoxide) and mixtures thereof.

The polythiol component of the inventive compositions may be any compound having two or more thiol groups per molecule. Suitable polythiols are described in U.S. Pat. No. 3,661,744 at col.8, In 76–col.9, In 46; in U.S. Pat. No. 4,119,617, col.7, Ins 40–57; U.S. Pat. No. 3,445,419; and U.S. Pat. No. 4,289,867. Especially preferred are polythiols obtained by esterification of a polyol with an $\alpha$ or $\beta$-mercaptocarboxylic acid such as thioglycolic acid, or $\beta$-mercaptopropionic acid. Particularly preferred polythiols are pentaerythritol tetramercaptoacetate and pentaerythritol tetrakis-$\beta$-mercaptopropionate (PETMP).

The ratio of the polyene to the polythiol component can be varied widely. Generally it is preferred that the ratio of thiol to ene groups be between 0.7:1 and 1.3:1, but ratios outside this range may occasionally be usefully employed without departing from the invention hereof.

While a curable composition using norbornene functional compounds of the invention may include both difunctional norbornenyl compounds and difunctional thiol compounds, it will be understood that at least a portion of at least one of these components should contain more than two functional groups per molecule to produce a crosslinked product when cured. That is, the total of the average number of norbornene groups per molecule of norbornene functional compound and the average number of coreactive thiol groups per molecule of the thiol functional compound should be greater than 4 when a crosslinked cured product is desired. This total is referred to as the "total reactive functionality" of the composition.

The initiator used in the curable thiol-ene formulations is suitably a free radical photoinitiator. Examples of free radical photoinitiators include benzoin and substituted benzoin compounds, benzophenone, Michler's ketone, dialkoxybenzophenones, dialkoxyacetophenones, peroxyesters described in U.S. Pat. Nos. 4,616,826 and 4,604,295, etc. The photoinitiator is employed in an amount effective for initiating cure of the formulation upon irradiation with UV light, suitably 0.1–10%, typically 0.5–5%.

The formulations also preferably include a stabilizer. Preferred stabilizers are described in EP 428,342. Such stabilizers are non-acidic nitroso compounds, particularly N-nitrosoarylhydroxylamines and salts thereof. Particularity suitable stabilizer compounds are the ammonium and aluminum salts of N-nitrosophenylhydroxylamine which may be usefully employed at levels between about 10 ppm and 2%, preferably 10–5,000 ppm.

As described in U.S. Pat. No. 5,208,281, triiodide and other polyiodides are useful shelf-life stabilizers for thiol-ene formulations.

The invention is illustrated by reference to the following non-limiting examples.

EXAMPLE 1

Dinorbornene resins were produced by Dieis-Alder cycloaddition of cyclopentadiene to ethoxylated bisphenol A. The same lot of acrylate starting material was used in both the control and the treated samples. Resins were filtered at 50° C. through a course frit Celite® C bed after synthesis. The treated sample was mixed with 2 wt % Magnesol® Polysorb 30/40 silicated magnesium oxide, stirred three hours at 45° C. and allowed to sit overnight. Celite® filter aid, 3 wt % was added, mixed for one hour at 45° C. and then the mixture filtered at 70° C. using a 1μ filter pad. The dinorbornene resins were then formulated into thiol-ene formulations using equivalent weights of pentaerythritol tetramercaptopropionate, 2 wt % Darocure® 1173 photoinitiator and 1000 ppm aluminum N-nitrosophenylhydroxylamine. Samples of the formulations were then stored at room temperature and at 5° C. under nitrogen. Viscosities of the formulations were taken at periodic intervals to ascertain their relative storage stability. Results are given in Table I.

TABLE I

| STORAGE INTERVAL | FORMULATION VISCOSITIES (Cumulative Change) | |
|---|---|---|
| (Temperature) | Example 1 | Control |
| 0 | 7178 | 6864 |
| 7 days (RT*) | 7904 (10%) | 8024 (17%) |
| 28 days (RT) | 8595 (20%) | 10441 (52%) |
| 90 days (RT) | 8985 (25%) | 14728 (115%) |
| 180 days (RT) | 10218 (42%) | 21627 (215%) |
| 180 days (5° C.) | 7520 (5%) | 9809 (43%) |

*RT = room temperature (approximately 21° C.).

EXAMPLE 2

The procedure of Example 1 was repeated using the same batch of norbornene resin for both control and treated samples. Results are shown in Table II.

TABLE II

| STORAGE INTERVAL | FORMULATION VISCOSITIES (Cumulative Change) | |
|---|---|---|
| (Temperature) | Example 2 | Control |
| 0 | 7187 | 7204 |
| 7 days (RT) | 8418 (17%) | 53520 (643%) |
| 28 days (RT) | 9714 (36%) | 69865 (870%) |
| 90 days (RT) | 14431 (101%) | 92660 (1186%) |
| 180 days (RT) | 15302 (113%) | 104348 (1348%) |
| 180 days (5° C.) | 8808 (23%) | 33213 (361%) |

Analysis for selected ions in the norbornene resins used in this Example gave the following results:
Untreated control: 11.8 ppm Cl$^-$; <0.5 ppm Br$^-$; 6.4 ppm Na$^+$; 1.5 ppm K$^+$.
Treated resin: <0.5 ppm Cl$^-$; <0.5 ppm Br$^-$; <1 ppm Na$^+$ <1 ppm K$^+$.

EXAMPLE 3 (COMPARATIVE EXAMPLE)

The treated norbornene resin used in Example 2 was spiked with 7.2 ppm Cl$^-$, as NaCl in a methanol solution using an equivalent weight of 18-Crown-6 to assure transfer of the salt into the resin. The spiked resin was then formulated as per Example II. After 7 days, the viscosity of the formulation had increased 44%, more than double the viscosity increase of the formulation made from the treated, unspiked resin.

EXAMPLE 4

The procedure of Example 2 was repeated except that the norbornene monomer used was hexanediol dinorbornene carboxylate and the viscosity was monitored for only seven days at room temperature. Results are given in Table III.

TABLE III

| STORAGE INTERVAL | FORMULATION VISCOSITIES (Cumulative Change) | |
|---|---|---|
| (Temperature) | Example 4 | Control |
| 0 | 215 | 210 |
| 7 days (RT) | 330 (53%) | 917 (337%) |

EXAMPLE 5

Treatment of triallyl-1,3,5-triazine-2,4,6(1H,3H,3H)-trione in the manner of Example I gave a reduction of chloride content from 5.2 ppm to 0.2 ppm. The treatment did not affect storage stability of a thiol-ene formulation prepared from this resin but the reduction in chloride content was considered desirable for electrical insulating and corrosion resistance properties of the formulation.

EXAMPLE 6

Samples of the untreated dinorbornene resin used in Example 2 were treated in the same manner as in that example except that the 2 wt % Magnesol® Polysorb 30/40 and 3 wt % Celite® filter aid, respectively, were replaced with, 2 wt % basic aluminum oxide and 1 wt % Celite®; 2 wt % silica gel and 1 wt % Celite®; and 3 wt % Magnesol® Polysorb 30/40 and no Celite®. Hydrolyzable ion content was determined by ion chromatography on two trials for each sample and results are shown in Table IV.

TABLE IV

| Sample Treatment | Chloride (ppm) | Bromide (ppm) | Sodium (ppm) | Potassium (ppm) |
|---|---|---|---|---|
| None | 9.8 | None Detected | 7.5 | 1.7 |
|  | 11.7 | None Detected | 9.3 | 2.0 |
| 2 wt % basic aluminum oxide and 1 wt % Celite® | 0.1 | None Detected | <0.2 | None Detected |
|  | <0.1 | None Detected | <0.2 | None Detected |
| 2 wt % silica gel and 1 wt % Celite® | 0.1 | None Detected | <0.2 | None Detected |
|  | 0.1 | None Detected | <0.2 | None Detected |
| 3 wt % Magnesol® Polysorb 30/40 and no Celite® | <0.1 | None Detected | <0.2 | None Detected |
|  | <0.1 | None Detected | <0.2 | None Detected |

Estimated detection limits for bromide were 0.5 ppm and for potassium were 0.2 ppm.

What is claimed is:

1. A treatment method for a polyene, the polyene being a plural norbornene functional compound and the method comprising contacting the untreated polyene with an amphoteric treating agent selected from the group consisting of silicated magnesium oxide, basic aluminum oxide, silica gel, magnesium oxide, magnesium hydroxide, calcium oxide, calcium hydroxide, barium oxide, and barium hydroxide for a contact time and the separating the treated polyene from the treating agent, the contact time being a sufficient time to yield a Cl− level in the polyene of less than 1.0 ppm after separation from the treating agent.

2. A method as in claim 1 wherein said untreated polyene has a Cl− level of 3 ppm or greater.

3. A method as in claim 1 wherein said contact time is a sufficient time to produce a Cl− level of 0.5 ppm or less.

4. A method as in claim 1 wherein said amphoteric treating agent is selected from the group consisting of silicated magnesium oxide, basic aluminum oxide and silica gel.

5. A method as in claim 4 wherein said contact time is a sufficient time to produce a Cl− level of 0.1 ppm or less and is further sufficient to produce a Na+ level of 0.5 ppm or less and a K+ level of 0.5 ppm or less.

6. A method as in claim 1 wherein said contact time is further sufficient to produce a Na+ level of 1.0 ppm or less.

7. A method as in claim 1 wherein said contact time is further sufficient to produce a K+ level of 1.0 ppm or less.

8. A method as in claim 1 wherein the treating agent has an average particle size between 2 microns and 200 microns.

9. A method as in claim 1 wherein the amphoteric treating agent is silicated magnesium oxide.

10. A polyene prepared by the method of claim 1.

11. A polyene prepared by the method of claim 2.

12. A polyene as in claim 11 wherein the amphoteric treating agent is silicated magnesium oxide and said contact time is a sufficient time to produce a Cl− level of 0.1 ppm or less and is further sufficient to produce a Na+ level of 0.5 ppm or less and a K+ level of 0.5 ppm or less.

13. A method of preparing a thiol-ene composition comprising:

contacting a polyene with an amphoteric treating agent selected from the group consisting of silicated magnesium oxide, basic aluminum oxide, silica gel, magnesium oxide, magnesium hydroxide, calcium oxide, calcium hydroxide, barium oxide, and barium hydroxide, the polyene being a plural norbornene functional compound;

separating the resin from the treating agent; and then, mixing the polyene with a polythiol;

the polyene being contacted with the treating agent for sufficient time improve the shelf-life of the thiol-ene composition.

14. A method as in claim 13 wherein the treating agent has a particle size between 2 microns and 200 microns.

15. A method as in claim 13 wherein the amphoteric treating agent is silicated magnesium oxide.

16. A method for improving the storage stability of a thiol-ene composition, the composition comprising a mixture of a polythiol and a polyene in amounts effective to cure by addition reaction of thiol groups of the polythiol to ene groups of the polyene so as to form a crosslinked polythioether, the polyene being a compound having plural norbornene groups thereon, the method comprising:

prior to mixing said polyene and said polythiol,
contacting the untreated polyene with an amphoteric treating agent selected from the group consisting of silicated magnesium oxide, basic aluminum oxide, silica gel, magnesium oxide, magnesium hydroxide, calcium oxide, calcium hydroxide, barium oxide, and barium hydroxide for a contact time, and then separating the treated polyene from the treating agent, the contact time being a sufficient time to yield a Cl− level in the polyene of less than 1.0 ppm after separation from the treating agent, and then mixing the thus treated polyene and the polythiol to form the thiol-ene composition.

* * * * *